United States Patent
Marakhtanov et al.

(10) Patent No.: US 9,287,096 B2
(45) Date of Patent: Mar. 15, 2016

(54) METHODS AND APPARATUS FOR A HYBRID CAPACITIVELY-COUPLED AND AN INDUCTIVELY-COUPLED PLASMA PROCESSING SYSTEM

(75) Inventors: Alexei Marakhtanov, Albany, CA (US); Eric Hudson, Berkeley, CA (US); Rajinder Dhindsa, San Jose, CA (US); Neil Benjamin, Austin, TX (US)

(73) Assignee: Lam Research Corporation, Fremont, CA (US)

(*) Notice: Subject to any disclaimer, the term of this patent is extended or adjusted under 35 U.S.C. 154(b) by 1386 days.

(21) Appl. No.: 12/237,179

(22) Filed: Sep. 24, 2008

(65) Prior Publication Data

US 2009/0149028 A1    Jun. 11, 2009

Related U.S. Application Data

(60) Provisional application No. 60/975,789, filed on Sep. 27, 2007.

(51) Int. Cl.
*H01J 37/32* (2006.01)

(52) U.S. Cl.
CPC ......... *H01J 37/32669* (2013.01); *H01J 37/321* (2013.01); *H01J 37/3211* (2013.01); *H01J 37/3266* (2013.01); *H01J 37/32091* (2013.01)

(58) Field of Classification Search
USPC ................ 156/345.43–345.49; 118/715, 722, 118/723 R, 723 E, 723 I; 315/111.21, 111.41, 315/111.51
See application file for complete search history.

(56) References Cited

U.S. PATENT DOCUMENTS

| | | | |
|---|---|---|---|
| 5,027,041 A | 6/1991 | Godyak et al. | |
| 5,435,881 A * | 7/1995 | Ogle | 156/345.42 |
| 5,944,942 A * | 8/1999 | Ogle | 156/345.46 |
| 5,998,933 A * | 12/1999 | Shun'ko | 315/111.51 |
| 6,077,384 A * | 6/2000 | Collins et al. | 156/345.29 |
| 6,204,607 B1 * | 3/2001 | Ellingboe | 315/111.51 |
| 6,273,022 B1 | 8/2001 | Pu et al. | |
| 2003/0150562 A1 | 8/2003 | Quon | |
| 2004/0060517 A1 * | 4/2004 | Vukovic et al. | 118/723 I |

(Continued)

FOREIGN PATENT DOCUMENTS

| | | |
|---|---|---|
| CN | 101019211 A | 5/2007 |
| TW | 376531 | 12/1999 |
| TW | 417134 | 1/2001 |

OTHER PUBLICATIONS

"International Preliminary Report on Patentability", Issued in PCT Application No. PCT/US2008/078115; Mailing Date: Apr. 8, 2010.

(Continued)

*Primary Examiner* — Maureen Passey
(74) *Attorney, Agent, or Firm* — Beyer Law Group LLP

(57) ABSTRACT

A capacitively-coupled plasma (CCP) processing system having a plasma processing chamber for processing a substrate is provided. The capacitively-coupled Plasma (CCP) processing system includes an upper electrode and a lower electrode for processing the substrate, which is disposed on the lower electrode during plasma processing. The capacitively-coupled Plasma (CCP) processing system also includes an array of inductor coils arrangement configured to inductively sustain plasma in a gap between the upper electrode and the lower electrode.

19 Claims, 8 Drawing Sheets

(56) References Cited

U.S. PATENT DOCUMENTS

2004/0194890 A1 10/2004 Moroz
2006/0175016 A1 8/2006 Edamura et al.

OTHER PUBLICATIONS

"Final Substantive Examination Report", Singapore Patent Application No. 201001703-6, Mailing Date: Mar. 15, 2012.
"Written Opinion", Singapore Patent Application No. 201001703-6, Mailing Date: Jul. 7, 2011.
"Search Report", Singapore Patent Application No. 201001703-6, Mailing Date: Jul. 7, 2011.
"International Search Report", Issued in PCT Application No. PCT/US2008/078115; Mailing Date: Jan. 28, 2009.
"Written Opinion", Issued in PCT Application No. PCT/US2008/078115; Mailing Date: Jan. 28, 2009.
Godyak, et al., "Distributed Ferromagnetic Inductively Coupled Plasma as an Alternative Plasma Processing Tool", Japanese Journal of Applied Physics, vol. 45, No. 10B, Japan,(Oct. 24, 2006),pp. 8035-8041.
Office Action in TW Appln. No. 097137530, mailed Feb. 19, 2014.

* cited by examiner

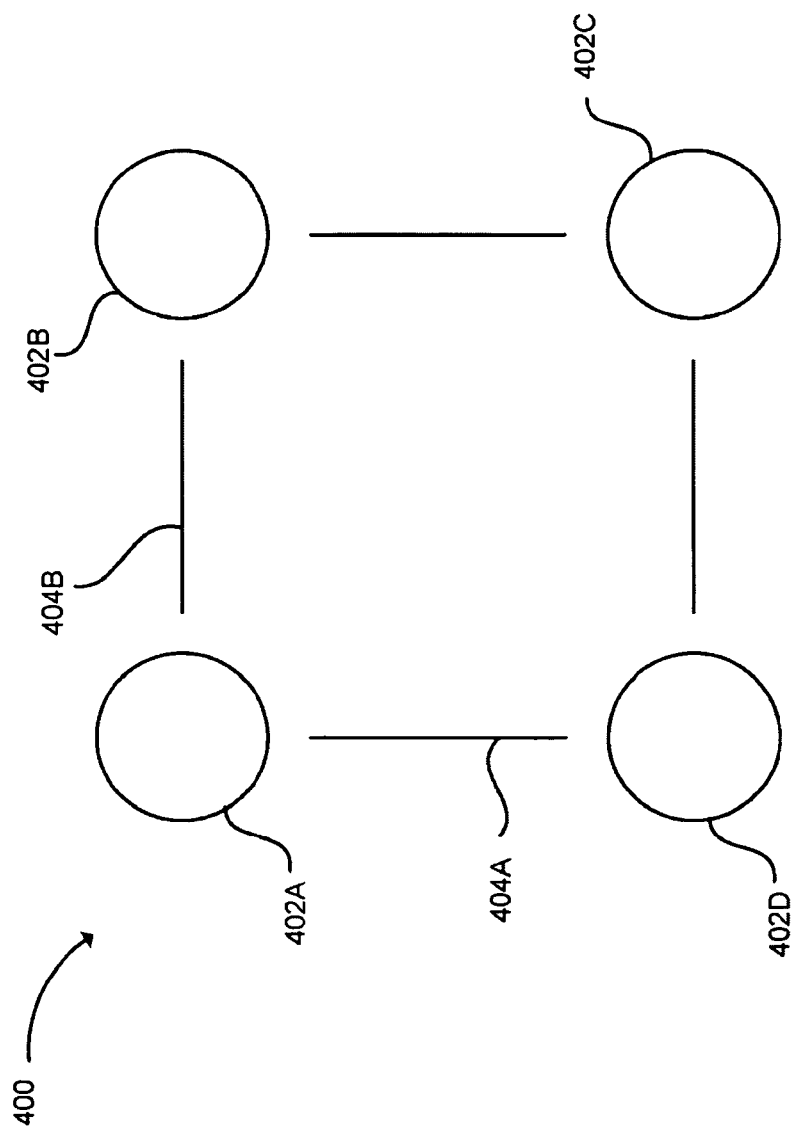

METHODS AND APPARATUS FOR A HYBRID CAPACITIVELY-COUPLED AND AN INDUCTIVELY-COUPLED PLASMA PROCESSING SYSTEM

PRIORITY CLAIM

This application is related to and claims priority under 35 U.S.C. §119(e) to a commonly assigned provisional patent application entitled "Methods and Apparatus For A Hybrid Capacitively-coupled and An Inductively-coupled Plasma Processing System," by Alexei Marakhtanov, Neil Benjamin, Eric Hudson, and Rajinder Dhindsa, Application Ser. No. 60/975,789 filed on Sep. 27, 2007, incorporated by reference herein.

BACKGROUND OF THE INVENTION

Advances in plasma processing have facilitated growth in the semiconductor industry. The semiconductor industry is a highly competitive market. The ability for a manufacturing company to be able to process substrate in different processing conditions may give the manufacturing company an edge over the competitor. Thus, manufacturing companies have dedicated time and resources to identify methods and/or arrangements for improving substrate processing.

In general, plasma processing systems may be constructed from a plurality of configurations. For example, a plasma processing system may be configured as a capacitively-coupled plasma (CCP) processing system or an inductively-coupled plasma (ICP) processing system. Each plasma processing configuration is built to enable processing in a range of process parameters.

However, in recent years, the types of devices that are being processed have become more sophisticated and may required more process control. In an example, devices being processed are becoming smaller and may require more precise control of plasma parameters, such as plasma density and uniformity across the substrate, for better yield. Furthermore, device fabrication may be a multi-steps process. Each step in the process may require different process regimes achievable only on plasma processing system of a specific configuration. Thus, the range of process parameters of a plasma processing system from a single configuration may fall short of delivering a total solution to process next-generation substrates.

To facilitate discussion, FIG. 1A illustrates a simplified representation of a prior art capacitively-coupled plasma (CCP) processing system. Plasma processing system 100 may be a single, double (DFC), or triple frequency radio frequency (RF) capacitive discharge system. In an example, radio frequencies may include, but are not limited to, 2, 27 and 60 MHz. Capacitively-coupled plasma processing system 100 may be configured to include a substrate 106 being disposed above a lower electrode 102.

Consider the situation wherein, for example, substrate 106 is being processed. During plasma processing, an RF generator 108 with a path to ground may supply an RF power to lower electrode 102 through an RF match 110. In an example, RF match 110 may be used to maximize power deliver), to the plasma system. The power from RF generator 108 may interact with a gas (not shown to simplifier illustration) to ignite plasma 114 in a gap 112 between an upper electrode 104 and substrate 106. In the example of FIG. 1A, upper electrode 104 is shown as being grounded. However, upper electrode 104 may also be powered. Plasma 114 may be used to etch and/or deposit materials onto substrate 106 to create electronic devices.

In CCP processing system such as plasma processing system 100 of FIG. 1A, gap 112 may be configured to be a very narrow gap. The gap may be about 1:5 to about 1:15 the aspect ratio of gap 112 to the diameter of upper electrode 104. By having narrow gap, processing steps requiring shorter gas resident time to minimize loading effect may be employed to process substrate. As the term is employed herein, loading refers to a measurable depletion of an active etchant cause by consumption in the etch process. Thus, CCP processing system may accommodate etching of electronic devices with very small features requiring very, low gas resident time.

In general, a limiting feature of CCP processing system 100, as illustrated in FIG. 1A, may be the inability to decouple ion density and ion energy. During plasma processing, it may be difficult in CCP processing system to independently control the ion density and the ion energy. For example, an attempt to increase ion energy by increasing RF power may cause an increase in sheath potential leading to an increase in ion energy. Another limiting feature of CCP processing system 100, as illustrated in FIG. 1A, may be the ability to generate high plasma density as compared to inductively-coupled plasma processing system. Thus, CCP processing system may not be able to accommodate plasma processing steps requiring high plasma density and/or independent control of the ion energy and the ion density.

FIG. 1B illustrates a simplified schematic representing a prior art inductively-coupled plasma (ICP) processing system. Inductively-coupled plasma processing system 150 may be configured to include a substrate 156 being disposed above a lower electrode 152. As shown in FIG. 1B, the lower electrode 152 may be grounded or may be powered with a first RF generator 158. RF power to lower electrode 152 may be delivered through an RF match 160. In an example, RF match 160 may be employed to maximize power delivery to the plasma system.

Consider the situation wherein, for example, substrate 156 is being processed. During plasma processing, a second RF generator 168 may supply RF power to an inductor coil 166. The cross section of inductor coil 166, as shown in FIG. 1B, may be a spiral coil with an air core being disposed above a dielectric window 154. The power from RF generator 168 to inductor coil 166 may produce a magnetic field 172 penetrating through dielectric window 154. The induced electric field may generate electrical current that mat, interact with gas to ignite and maintain plasma 164.

In contrast to the CCP processing system of FIG. 1A, plasma 164 being generated by ICP processing system tends to have higher density at similar RF power levels. One main difference between ICP processing system 150 and CCP processing system 100 may be the way RF power is coupled to plasma. Except for the low bias RF power from RF generator 158 being applied to substrate 156, RF power may be coupled to plasma 164 through dielectric window 154 in ICP processing system 150. Thus, high ion density and low plasma potential may be achieved in ICP processing system by employing efficient, non-capacitive coupling of RF power to plasma.

As shown in FIG. 1B, plasma 164 may have a torroidal/doughnut shape, where the plasma doughnut may be formed between dielectric window 154 and substrate 156 in between a gap 162. The magnetic field 172, as shown in FIG. 1B, may peaked off axis, i.e., half (½) the distance of the radius 170 of inductor spiral coil 166 with minima at the center of the coil and the walls. Thus, the plasma doughnut 164 may have the highest density at about half (½) the distance of the radius 170 of inductor spiral coil 166 due to the magnetic field 172 generated by inductor spiral coil 166.

As may be appreciated by those skilled in the art, the gap 162 in ICP processing system needs to be of a sufficient height, i.e., the height of gap 162 tends to be about the radius of inductor coil 166, to accommodate the magnetic field 172 being generated b inductor coil 166. Sufficient gap height may be necessary such that RF power induced through dielectric window 154 mats be absorbed in plasma 164. By having sufficient gap height for plasma to absorb RF power, damages to substrate 156 may be avoided. For example, if the gap is too narrow, magnetic field 172 may interact with substrate 156 to produce electric field inducing current and capacitive coupling instead of producing and/or sustaining plasma. The capacitive coupling may lead to an arcing of the devices on the substrate and/or an increased in temperature on the substrate, which might be undesirable for plasma processing. Thus, ICP processing system may be limited to operating with relatively large gap for plasma processing.

Another limitation with ICP processing system 150, as shown by FIG. 1B, may be in processing of very large substrate. In order to achieve a relatively good uniformity of plasma, as affected by the magnetic field, over a very large substrate, inductor coil 166 may need to be scaled up to the appropriate size. Therefore, the chamber malt end up becoming ver, large because the region of maximum plasma is about half the radius 170 of inductor coil 166. To achieve good uniformity of plasma, the inductor coil 166 may need to be large enough to cover the large substrate and not give rise to non-uniformity at the edges. However, as the chamber becomes enlarged to compensate for the inductor coil, the design of ICP processing system may, pose a variety of mechanical and/or engineering challenges. For example, the vacuum load may be very high in order to support the enlarged ICP processing system. In addition, the gas may not be evacuated rapidly enough leading to undesirably long resident time. Furthermore, a larger dielectric window 154 may, be more difficult to handle.

Even though ICP processing system may be able to deliver high density plasma and decoupling of ion density and ion energy, ICP processing system may be limited to relative large gap and design challenges resulting from compensating for plasma uniformity when processing larger substrates.

FIG. 2 shows a simplified schematic of prior art inductor coils arrangement as proposed by V. Godyak in "Distributed Ferromagnetic Inductively Coupled Plasma as an Alternative Plasma Processing Tool", *Japanese Journal of Applied Physics* Vol. 45, No. 10B, 2006, pp. 8035-8041.

As shown in FIG. 2, a plurality of cores 202A, 202B, 202C, 202D, 202E, and 202F may be employed. In contrast to the air core of FIG. 1B, each core may be constructed of a magnetic material such as ferrite or powder iron. Each core from the plurality of magnetic cores (202 A-F) may be configured with a coil from a plurality of coils 204A, 204B, 204C, 204D, 204E, and 204F to act as small inductor sources. For example, as shown in FIG. 2, coil 204A corresponds to the winding for magnetic core 202A. The magnetic core materials may be employed to confine the magnetic field to a region to improve coupling, in contrast to FIG. 1B, where the coil may be a spiral arrangement to induce a torroidal/doughnut shape magnetic field from the current from the coils. Thus, the arrangement of a plurality of small inductor cores may address the spatial uniformity problem of a single, large spiral coil of FIG. 1B.

As shown in FIG. 2, the inductor cores (202 A-F) may be wound with coils (204 A-F) and connected in series in a hexagonal close packing arrangement to improve uniformity and increase efficiency of magnetic coupling. However, the hexagonal close packing arrangement is employed as a space filling for the inductor coils without any attempt to coordinate these core elements.

As may be appreciated from the foregoing, CCP processing system may be limited to low density plasma and/or inability to decouple the ion density and the ion energy. Even though ICP processing system may be able to overcome the limitations of generating high density, plasma and/or decoupling of ion density and ion energy, ICP processing system may be limited to relatively large gap and/or design challenges when processing larger substrates. Given the need to stay competitive in the semiconductor industry, enhancements to the capabilities of CCP and ICP processing systems are highly desirable.

SUMMARY OF INVENTION

The invention relates, in an embodiment, to a capacitively-coupled plasma (CCP) processing system having a plasma processing chamber for processing a substrate. The capacitively-coupled plasma (CCP) processing system includes an upper electrode and a lower electrode for processing the substrate, which is disposed on the lower electrode during plasma processing. The capacitively-coupled Plasma (CCP) processing system also includes an array of inductor coils arrangement having a plurality of inductor coils configured to inductively sustain plasma in a gap between the upper electrode and the lower electrode, wherein individual ones of at least a subset of the plurality of inductor coils are independently controllable with respect to at least one of phase and RF power.

The above summary relates to only one of the many embodiments of the invention disclosed herein and is not intended to limit the scope of the invention, which is set forth is the claims herein. These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which:

FIG. 4 shows, in accordance with an embodiment of the invention, a simplified schematic of a top view of a section of an upper electrode illustrating slits radial to the inductor coils in the upper electrode.

DETAILED DESCRIPTION OF EMBODIMENTS

Figure 1A:
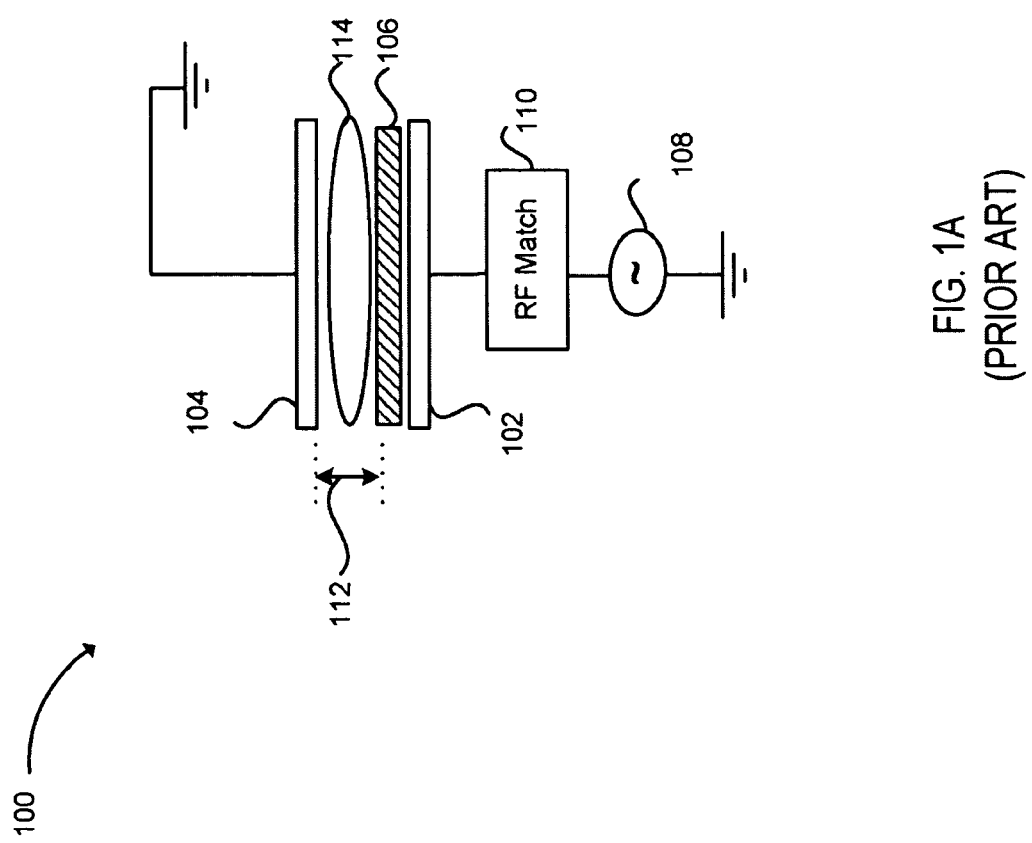
FIG. 1A illustrates a simplified representation of a prior art capacitively-coupled plasma (CCP) processing system.

The present invention will now be described in detail with reference to a few embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

In accordance with embodiments of the invention, there are provided methods and arrangements for configuring capacitively-coupled plasma processing systems with an array of inductor coils arrangement to enable the plasma processing system to operate as either a capacitively-coupled and/or an inductively-coupled plasma processing system. Embodiments of the invention may include employing the array of inductor coils arrangement to provide high density plasma in a narrow gap of a plasma processing chamber. With localized control of each inductor coil in the array of inductor coils arrangement, plasma uniformity may be achieved to obtain higher yield in processing of electronic devices.

In an embodiment, the plasma processing system may be configured with the array of inductor coils arrangement. In an example, the array of inductor coils arrangement may be configured with a set of bobbins as the magnetic cores. In another example, the magnetic cores may be a set of horseshoe magnets. In an embodiment, the magnetic cores may be constructed from magnetic materials such as ferrite or powder iron. By employing magnetic material as cores, magnetic field may be confined to a region to improve coupling in contrast to prior art ICP system employing air core in the spiral inductor coil.

In an embodiment, each magnetic core mat be wound with a coil. The coil on each inductor coil may be remoted from an upper electrode to minimize capacitive coupling in contrast to prior art cohere a spiral coil is disposed on a dielectric Window.

In the example of bobbins as magnetic cores, the bobbins adjacent to each other may be arranged in alternating, opposite poles in an embodiment. By coordinating alternating, opposite poles arrangement, the magnetic flux from the pair of adjacent bobbins with opposing poles are allowed to couple forming a looping magnetic field that may penetrate into the plasma region to sustain plasma in an embodiment. In order to complete the magnetic circuit for adjacent pair of bobbins, magnetic connectors may be employed to connect across the set of bobbins. Magnetic connectors mats be magnetic straps or a magnetic plate. Magnetic straps and/or magnetic plate may be constructed from the same magnetic materials as the cores.

In the example of horseshoe magnets as magnetic cores, the horseshoe magnet is curved in a "U" shape so that the two opposing poles lie on the same plane. Thus, each horseshoe magnet is similar to a pair of opposing poles of adjacent bobbins with connecting straps. However, in contrast to the bobbin, horseshoe magnet is forced to couple with opposing poles on the same magnet. Whereas, the magnetic field of a pole on the bobbin may loop around and couple with any opposing poles of adjacent bobbins.

In contrast to prior art, the poles of magnetic cores in the array of inductor coils arrangement are coordinated to enhance coupling of the magnetic flux instead of acting as independent inductor sources of the prior art. The coordinated couplings with adjacent pairs of opposing poles in the array, of inductor coils arrangement allow for the control of the set of looping magnetic fields into the plasma region. Thus, plasma uniformity may be enhanced through localized control.

In an embodiment, the spacing of opposing magnetic poles may be optimized with the plasma chamber gap to control the distance the looping magnetic fields may penetrate into the plasma region without damaging a substrate during plasma processing. In an embodiment, the spacing of opposing magnetic poles may range from about 25 percent of the gap to the full gap. In contrast to prior art, the spacing of magnetic cores may be optimized for plasma processing instead of being packed in space-filling arrangement. Furthermore, ICP may be employed to process substrate with relatively narrow gap similar to CCP process instead of the limitation of a wider gap of the prior art ICP process.

In an embodiment, the upper electrode may be configured with an electrostatic shield to make a conductive material appears to be an insulator. In an example, electrostatic shield may be formed by making slits, in an upper electrode, radial to inductor coils. By employing the electrostatic shield, the upper electrode is configured to appear to be an insulator in the azimuthal direction. In contrast to prior art, a conductive material, i.e., the upper electrode, may be employed in ICP process with minimal inductive coupling from the inductor coils instead of being limited to employing a dielectric window.

In an embodiment, the set of inductor coils may be arranged in a self-similar pattern for uniformity or in a predetermined pattern to simulate the magnetic field of a larger inductor coil. In another embodiment, each inductor coil in a set of inductor coils may be independently controlled to vary frequency and/or RF power being delivered to the inductor coil to achieve local steering of the plasma.

In an embodiment, during ICP processing employing inductor coils arrangement, upper electrode may be configured to be grounded, RF powered or DC biased. Alternatively or additionally lower electrode mains be powered by the same or different radio frequency.

The features and advantages of the present invention may be better understood with reference to the figures and discussions (with prior art mechanisms and embodiments of the invention contrasted) that follow.

Figure 3A:
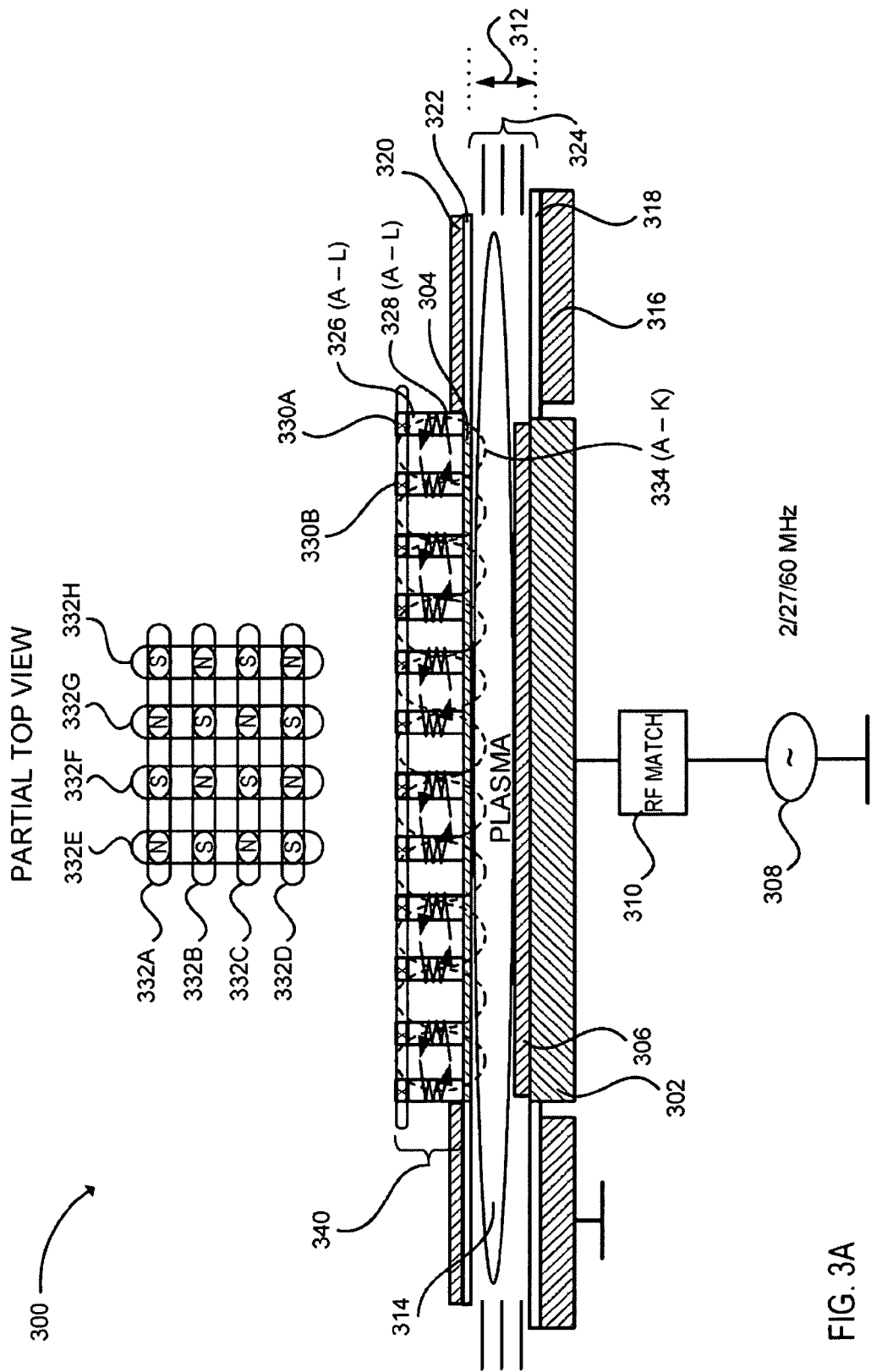
FIG. 3A shows, in accordance with an embodiment of the invention, a simplified schematic of a capacitively-coupled plasma processing system configured with an array of inductor coils arrangement to enable inductive coupling of plasma.

FIG. 3A shows, in accordance with an embodiment of the invention, a simplified schematic of a capacitively-coupled plasma processing system configured with an array of inductor coils arrangement to enable inductive coupling of plasma. As shown in FIG. 3A, plasma processing system 300 may be configured as a typical CCP processing system.

Consider the situation wherein, for example, a substrate 306 is being processed in the capacitively-coupled mode in plasma processing system 300. Plasma processing system 300 may be configured to include substrate 306 being disposed above a lower electrode 302. During plasma processing, an RF generator 308 with a path to ground may supply an RF power to lower electrode 302 through an RF match 310. In an example, RF match 310 may be employed to maximize power delivery to plasma system. The radio frequency, may include, but are not limited to 2, 27 and 60 MHz. The power from RF generator 308 tends to interact with a gas (not shown to simplify illustration) to ignite plasma 314 between an upper electrode 304 and substrate 306. As shown in FIG. 3A, lower electrode 306 may be configured adjacent to a lower ground extension ring 316 with a lower ground extension cover ring 318. Similarly, upper electrode 304 may be configured adjacent to an upper ground extension ring 320 with an upper ground extension cover ring 322.

In the implementation of FIG. 3A, plasma 314 mats be confined between a gap 312 by a set of confinement rings 324. As aforementioned, gap 312 may be a relatively narrow gap in CCP processing system to facilitate processing parameters requiring shorter gas resident time to minimize loading effect.

As can be appreciated from the foregoing, plasma processing system 300 as shown in FIG. 3A may incorporate other additional features often employed in CCP processing systems such as an adjustable electrode gap 312, adjustable gaps for confinement rings 324, DC and/or RF powered upper electrode 304, and the like. In accordance with an embodiment of the invention, plasma processing system 300, as shown in FIG. 3A, is shown without limitations as a representation of a fully functional CCP processing system.

However, consider a situation wherein, for example, a step in the process may require processing parameters outside the capability of the CCP processing system. Plasma processing system 300 may be switched from the capacitively-couple mode to an inductively couple mode in accordance with an embodiment of the invention.

In an embodiment, plasma processing system 300 may be configured with an array of inductor coils arrangement 340, as shown in FIG. 3A. The array of inductor coils arrangement 340 is configured with a set of bobbins (326 A-L). The bobbins (326 A-L) may be constructed of a magnetic material such as ferrite or powder iron.

In accordance with an embodiment of the invention, each bobbin, for example bobbin 326A of FIG. 3A, is essentially an individual rod magnet arranged in an array disposed above upper electrode 304. Each rod magnet or bobbins, for example bobbin 326A, may be configured with a North (N) magnetic pole and a South (S) magnetic pole on each end of the rod.

In an embodiment, the set of bobbins (326 A-L) may be connected across the top by a set of straps (332 A-H). The straps may be constructed of high permeability materials, such as ferrite or powder iron. These straps are made of the same kind of magnetic material as the bobbins to complete the magnetic circuit between the set of bobbins (326 A-L). Alternatively, the straps may be a simple plate, also made of high permeability material such as ferrite or powder iron. Thus, the magnetic circuit between an adjacent pair of bobbins in a set of bobbins (326 A-L) may be completed.

Figure 1B:
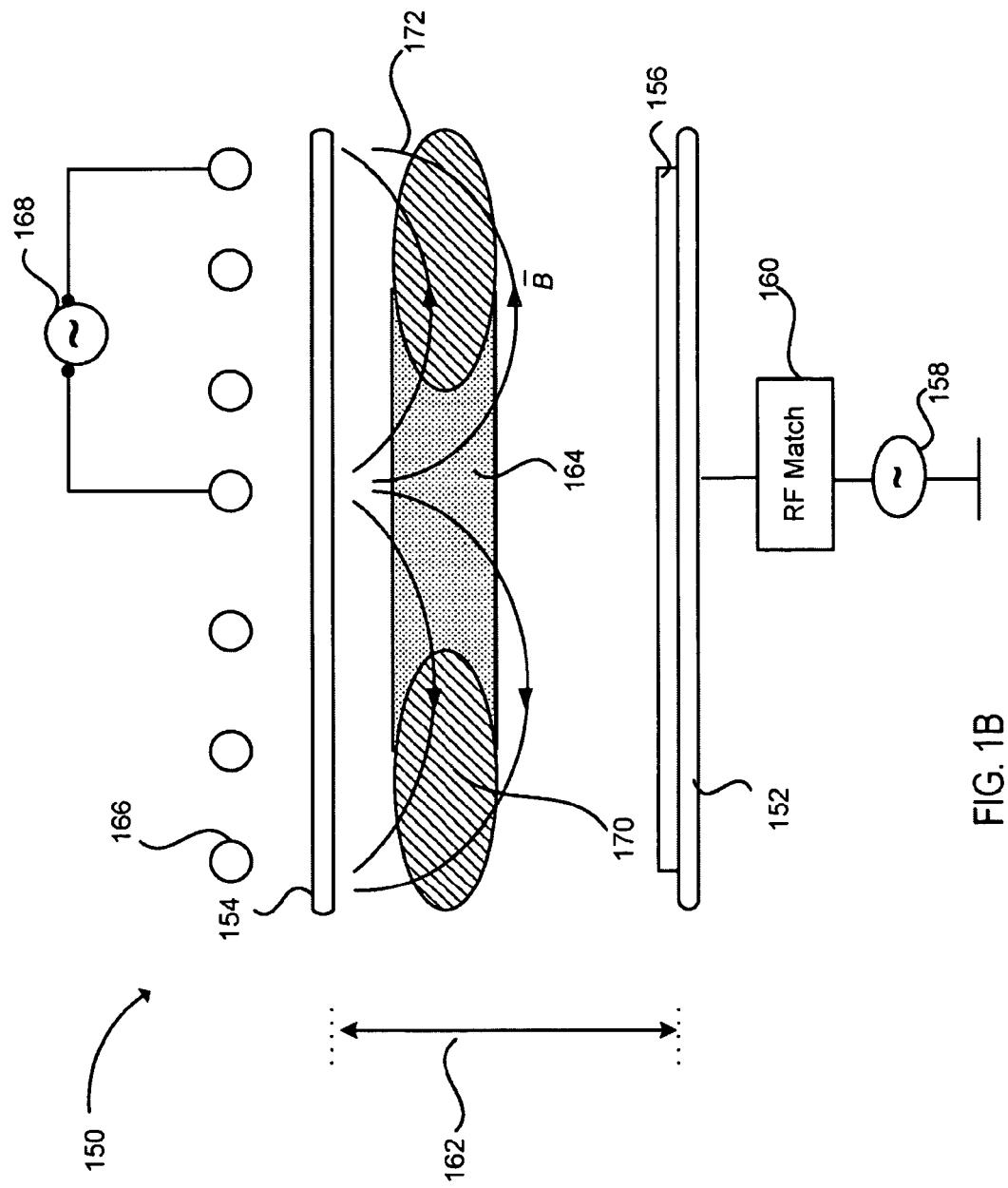
FIG. 1B illustrates a simplified schematic representing a prior art inductively-coupled plasma (ICP) processing system.
Figure 2:
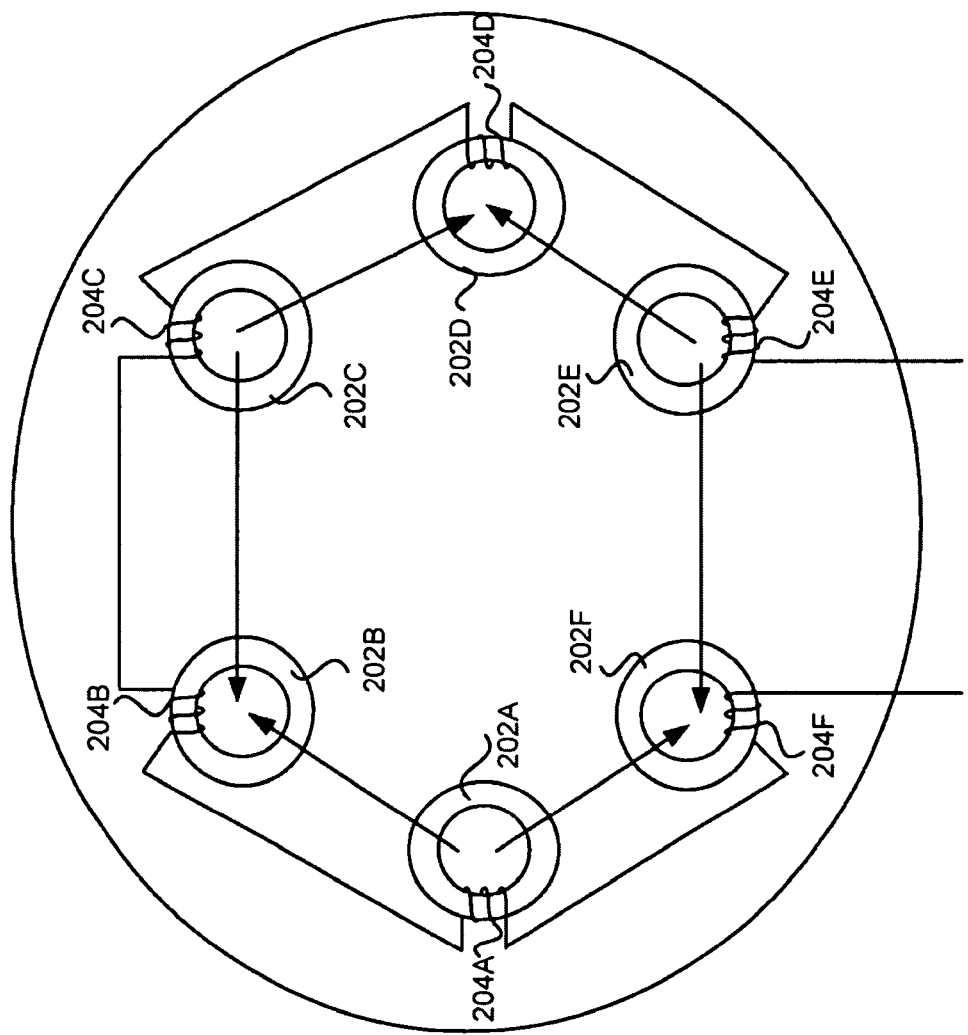
FIG. 2 shows a simplified schematic of prior art inductor coils arrangement as proposed by V. Godyak.

In an embodiment, each bobbin in a set of bobbins (326 A-L), for example bobbin 326A, may be wound with a coil, for example coil 328A, in a set of coils (328 A-L). In accordance with an embodiment, the set of coils (328 A-L) as wound on the corresponding set of bobbins (326 A-L) may be remoted from upper electrode 304 to minimize capacitive coupling in contrast to prior art spiral coil 166 disposed on dielectric window 154 of FIG. 1B.

In accordance with an embodiment of the invention, the set of bobbins (326 A-L) may be arranged in alternating opposite poles, adjacent to each other, in an embodiment. For example, bobbin 326A is shown in FIG. 3A with a top view of the N pole on top 330A, and the adjacent bobbin 326B is shown with a top view of the S pole on top 330B. Thus, the array of bobbins (326 A-L) may be arranged in alternating opposite poles to allow the magnetic field of a pair of adjacent bobbins with opposing poles to couple forming the set of looping magnetic fields (334 A-K) in an embodiment.

In contrast to prior art, the poles of magnetic cores in the array of inductor coils arrangement are coordinated to enhance coupling of the magnetic flux instead of acting as independent inductor sources of the prior art. The coordinated couplings with adjacent pairs of opposing poles in the array of inductor coils arrangement allow for the control of the set of looping magnetic fields into the plasma region. Thus, plasma uniformity may be enhanced through localized control.

In an embodiment, the spacing of the bobbins may be optimized with the gap 312 height to get the desired penetration of looping magnetic fields (334 A-K) of adjacent bobbins into the plasma region as shown in FIG. 3A. The looping magnetic fields (334 A-K) of adjacent bobbins may penetrate gap 312 the distance of the separation of the adjacent bobbins. It is desirable for the looping magnetic fields (334 A-K) to penetrate through the upper electrode 304 to strike and maintain plasma in gap 312 without damaging substrate 306. Typically, the spacing may range from about 25 percent of the gap to the full height of the gap. Thus, the spacing of adjacent bobbins may be optimized to the gap 312 height to achieve the desired looping magnetic fields as required by the plasma processing parameters.

In contrast to prior art, the spacing of magnetic cores may be optimized for plasma processing instead of being packed in hexagonal space-filling arrangement. Furthermore, ICP may be employed to process substrate with relatively narrow gap similar to CCP process instead of the limitation of a wider gap of the prior art ICP process.

Figure 3B:
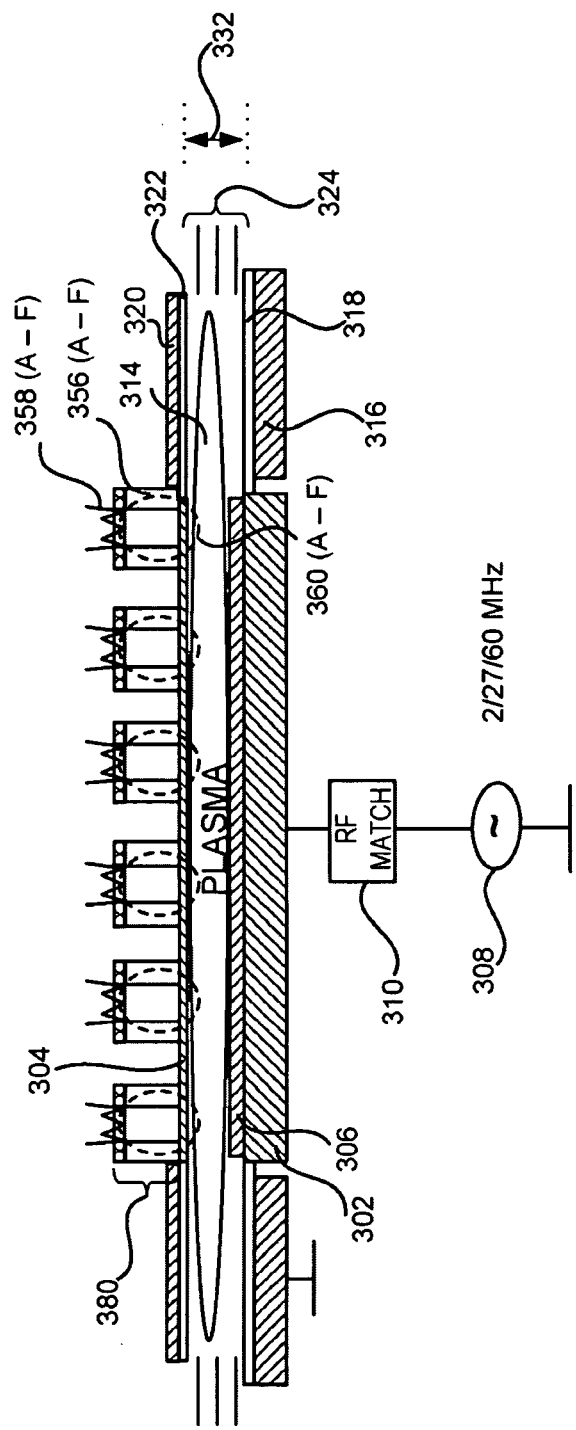
FIG. 3B shows, in accordance with an embodiment of the invention, a simplified schematic of a capacitively coupled plasma processing system configured with an array of horseshoe inductor coils arrangement to enable inductive coupling of plasma.

Alternatively in another embodiment, horseshoe magnets may be employed instead of rod magnets to provide an array of inductor coils arrangement. FIG. 3B shows, in accordance with an embodiment of the invention, a simplified schematic of a capacitively-coupled plasma processing system configured with an array of horseshoe inductor coils arrangement to enable inductive coupling of plasma.

Plasma processing system 300 may be configured with another array of inductor coils arrangement 380, as shown in FIG. 3B. The array of inductor coils arrangement 380 may be configured with a set of horseshoe magnets (356 A-F). The horseshoe magnets (356 A-F) may be constructed of a magnetic material such as ferrite or powder iron.

In an embodiment, each horseshoe magnet in a set of horseshoe magnets (356 A-F), for example horseshoe magnet 356A, may be wound with a coil, for example coil 358A, in a set of coils (358 A-F). In accordance with an embodiment, the set of coils (358 A-F) as wound on the corresponding set of horseshoe magnets (356 A-L) may be remoted from upper electrode 304 to minimize capacitive coupling in contrast to prior art spiral coil 166 disposed on dielectric Window 154 of FIG. 1B.

Each horseshoe magnet, for example horseshoe magnet 356A of FIG. 3B, is also configured with a North (N) magnetic pole and a South (S) magnetic pole on each end similar to the rod magnet. However, horseshoe magnet is curved in a "U" shape so that the two opposing poles lie on the same plane. Thus, horseshoe magnet, for example horseshoe magnet 356A of FIG. 3B, may be similar to a pair of opposing poles of adjacent rod magnets with connecting strap of FIG. 3A.

However, in contrast to the bobbins of FIG. 3A, horseshoe magnet may be forced to couple with opposing poles on the same magnet. Whereas, the magnetic field of a pole on the bobbin in FIG. 3A may loop around and couple with any opposing poles of adjacent bobbins.

As can be appreciated by those skilled in the art, the spacing of the opposing poles on each horseshoe magnet may also be optimized to the gap 332 height to achieve the desired looping magnetic Fields (360 A-F) as required by the plasma processing parameters.

As may be appreciated from the foregoing, the main difference between the set of bobbin inductor coils arrangement of FIG. 3A and the set of horseshoe magnets inductor coils arrangement of FIG. 3B is in the forced coupling within a horseshoe magnet instead of coupling with any opposing poles of adjacent bobbins. However, both bobbin arrangement and horseshoe magnet employed predetermined, coordinated coupling of opposing poles to arrange inductor coils instead of merely employing close-packing, space-filling of V. Godyak's inductor coils arrangement.

As shown in FIGS. 3A and 3B, the bobbins and/or horseshoe magnets may be disposed above upper electrode 304 in an embodiment. In another embodiment, bobbins and/or horseshoe magnets may be disposed in other configurations with upper electrode 304. For example, the upper electrode 304 may be counter-bored so that the bobbins and/or horseshoe magnets ma), be partially buried in the upper electrode 304, in accordance with an embodiment of the invention. In another example, the bobbins and/or horseshoe magnets may penetrate all the way through upper electrode 304 to be flushed or protruded from plasma facing surface of upper electrode 304. If the bobbins and/or horseshoe magnets protrude or penetrate all the way through, the exposed ends may need to be capped or protected to ensure there are no adverse effects on the process.

In addition, to prevent inductive coupling, upper electrode 304 may need to be constructed of a high resistive material, needs to be very thin or needs to be slitted. FIG. 4 shows, in accordance with an embodiment of the invention, a simplified schematic of a top view of a section of an upper electrode illustrating slits radial to the inductor coils in the upper electrode.

As shown in FIG. 4, a section 400 of upper electrode 304 of FIGS. 3A and/or 3B may configured with a plurality of inductor coils 402A, 402B, 402C, and 402D. A conductive material, such as upper electrode 304 of FIG. 3A, may be made to appear to be an insulator by providing an electrostatic shield or Faraday shield. In an embodiment, the electrostatic shield may be formed by making slits all the way through the surface of the upper electrode radial to the inductor coils. For example, the slit 404A is radial from inductor coil 402A to extend to 402D. Radial slit 404A does not necessarily touch or come to the edge of inductor coils 402A or 402D. Hence, by employing the electrostatic shield, a conductive material such as upper electrode 304 of FIG. 3A may be made to appear to be an insulator in the azimuthal direction.

By employing the electrostatic shield, the upper electrode is configured to appear to be an insulator in the azimuthal direction. In contrast to prior art, a conductive material, i.e., the upper electrode, may be employed in ICP process with minimal inductive coupling from the inductor coils instead of being limited to employing a dielectric window.

As may be appreciated by those skilled in the art, other techniques may be employed to make a conductive material appears to be an insulator. For example in accordance with an embodiment, upper electrode 304 may be selected to be a more resistive material so the radial slits do not have to be cut all the way through the surface. For more resistive materials, the upper electrode may be constructed as a thinner sheet in an embodiment. Alternatively, another method to make the conductive material appears to be an insulator is to create trenches with silicon oxide or quartz embedded as barrier in another embodiment. Thus, inductive coupling between the inductor coils and upper electrode may be eliminated or minimized.

In an embodiment, the set of inductor coils may be arranged in a self-similar pattern for uniformity or in a specific pattern to simulate the magnetic field of a larger inductor coil.

Figure 5A:
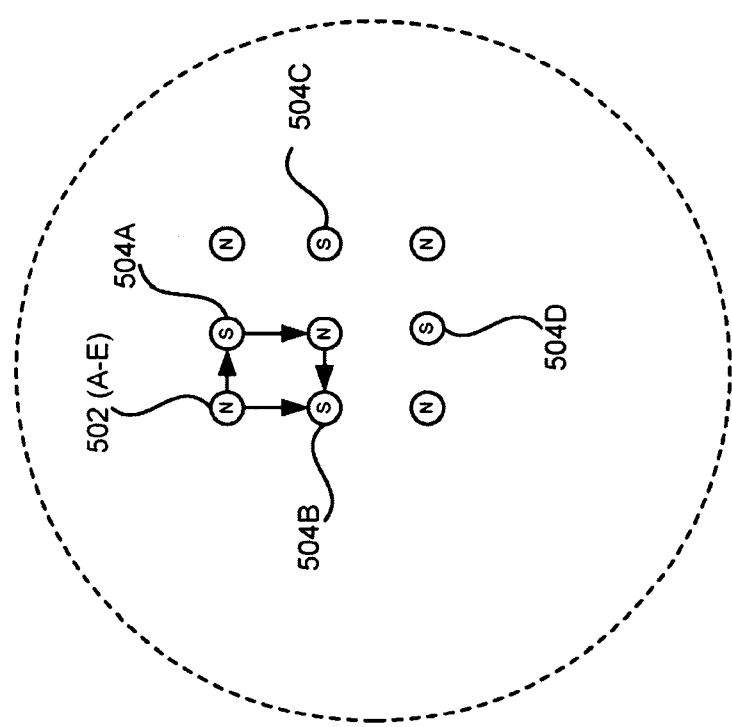
FIG. 5A shows, in accordance with an embodiment of the invention, a simplified schematic of a top view of a representative checkered board array arrangement for inductor coils.

FIG. 5A shows, in accordance with an embodiment of the invention, a simplified schematic of a top view of a representative checkerboard array arrangement for inductor coils. As shown in FIG. 5A, inductor coils with North poles (502 A-E) maid be arranged in an alternating checkerboard arrangement with inductor coils with opposing South poles (504 A-D). The magnetic field may be very uniform in the checkerboard arrangement because of the self-similar nature of the alternating pattern. Thus, the uniformity of plasma may be improved over that of prior art spiral coil 166 of FIG. 1B. For example, in processing a large substrate, the coil does not need to be sized up to improve plasma uniformity as required by prior art ICP processing system.

Figure 5B:
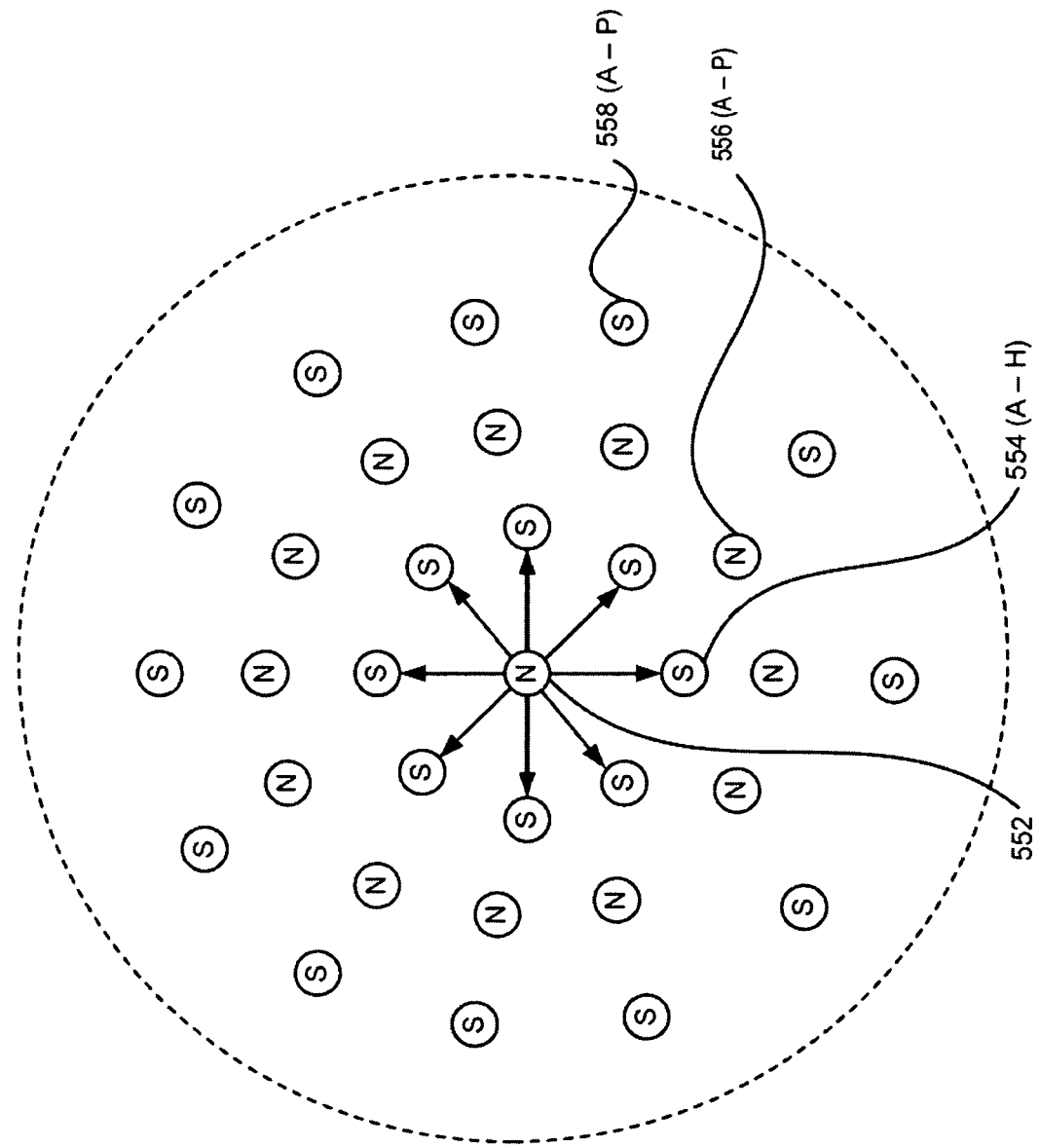
FIG. 5B shows, in accordance with an embodiment of the invention, a simplified of schematic of a top view of a representative alternating concentric rings arrangement for inductor coils simulating a spiral coil.

FIG. 5B shows, in accordance with an embodiment of the invention, a simplified of schematic of a top view of a representative alternating concentric rings arrangement for inductor coils simulating a spiral coil. In the implementation of FIG. 5B, sets of inductor coils 552, 554 A-H, 556 A-P, and 558 A-P may be arranged in concentric circles with alternating sets of opposing poles of inductor coils. For example, in the implementation of FIG. 5B, the pole for inductor coil set 552 is N and the pole for inductor coils set 554 A-H is S. As may be appreciate from the foregoing, inductor coils may be arranged in a predetermined pattern to simulate a desired magnetic field based on the process parameters requirements.

In an embodiment, the inductor coils arrangement may) be driven by a same radio frequency globally or specifically tune at a particular inductor coil to achieve local control or steering of the plasma. In another embodiment, RF power to the inductor coils may be global through a matching network or through an amplifier from a distributed power arrangement for local control.

In an embodiment, during ICP processing employing inductor coils arrangement, upper electrode may be configured to be grounded, RF powered or DC biased. Alternatively or additionally, lower electrode may be powered by the same or different radio frequency. As can be appreciated by those skilled in the art, the CCP processing system employing inductor coils arrangement allows for hybridization of features from CCP processing system in ICP processes. Thus, operating parameters for processing substrates may advantageously be widened from such hybridization.

As can be appreciated from the foregoing, one or more embodiments of the invention provide for a plasma processing system capable of both CCP and/or ICP. By hybridizing a CCP processing system to include ICP capability, the processing range has been widened. By achieving ICP in a CCP processing system, the plasma density has been increased beyond what is possible Kith a capacitively-coupled plasma processing system. By hybridizing the CCP processing system with inductive coils which ma), produce very uniform plasma, substrate may be processed in ICP mode in a very narrow gap system resulting in lower residence time for the gas species. By removing the coils, strayed electrostatic fields may be eliminated from plasma. By employing the upper electrode in the design, the dielectric window may be eliminated resulting in simpler chamber design. Thus, device manufacturer employing the hybridized CCP plasma processing system may switch on demand between an inductive-coupled plasma mode and/or a capacitively-coupled plasma mode to take advantage of the features provide by both technologies.

While this invention has been described in terms of several embodiments, there are alterations, permutations, and equivalents, which fall within the scope of this invention. It should also be noted that there are many alternative ways of implementing the methods and apparatuses of the present invention. Furthermore, embodiments of the present invention may find utility in other applications. The abstract section is provided herein for convenience and, due to word count limitation, is accordingly written for reading convenience and should not be employed to limit the scope of the claims. It is therefore intended that the following appended claims be interpreted as including all such alterations, permutations, and equivalents as fall within the true spirit and scope of the present invention.

What is claimed is:

1. A capacitively-coupled plasma (CCP) processing system having a plasma processing chamber capable of both CCP processing and inductively coupled plasma processing for processing a substrate, comprising:
    at least an upper electrode and a lower electrode for processing said substrate, said substrate being disposed on said lower electrode during plasma processing, wherein the upper electrode has at least one slit extending through the upper electrode; and
    an array of inductor coils arrangement having a plurality of inductor coils, said array of inductor coils arrangement being disposed above and in contact with said upper electrode, said array of inductor coils arrangement configured to inductively sustain plasma in a gap between said upper electrode and said lower electrode, wherein individual ones of at least a subset of said plurality of inductor coils are independently controllable with respect to and between phase and RF power, wherein said array of inductor coils arrangement includes at least
    a set of magnetic cores, wherein each magnetic core is a single unitary magnetic core, and
    a set of coils, each single unitary magnetic core is wound with a coil of said set of coils, wherein a first magnetic core in said set of magnetic cores is separated from an adjacent magnetic core by a distance of about 25 percent to 100 percent of said gap between said upper electrode and said lower electrode.

2. The CCP processing system of claim 1 further comprising at least one radio frequency (RF) power source, said RF power source being configured to capacitively ignite and sustain plasma between said upper electrode and said lower electrode.

3. The CCP processing system of claim 2, wherein said RF power source has an RF frequency of at least one of about 2 MHz, about 27 MHz, and about 60 MHz.

4. The CCP processing system of claim 1, wherein said each magnetic core of said set of magnetic cores is a bobbin, said bobbin in a set of bobbins is magnetically coupled by a set of magnetic connectors so that a magnetic field of each said bobbin in said set of bobbins couples with any opposing magnetic pole of adjacent ones of said set of bobbins.

5. The CCP processing system of claim 4, wherein said set of magnetic connectors is disposed on said set of magnetic cores to complete magnetic circuits for adjacent pairs of bobbins.

6. The CCP processing system of claim 4, wherein a first bobbin in said set of bobbins is arranged in alternating, opposing magnetic pole to an adjacent bobbin.

7. The CCP processing system of claim 4, wherein said set of connectors is at least one of a set of magnetic straps and a magnetic plate.

8. The CCP processing system of claim 7, wherein said set of magnetic connectors includes at least said set of magnetic straps formed of at least one of ferrite and powder iron.

9. The CCP processing system of claim 4, wherein each magnetic connector of said set of magnetic connectors is a magnetic material, said magnetic material is made of at least one of ferrite and powder iron.

10. The CCP processing system of claim 1, wherein said each magnetic core of said set of magnetic cores is a horseshoe magnet.

11. The CCP processing system of claim 1, wherein each magnetic core of said set of magnetic cores is a magnetic material, said magnetic material is made of at least one of ferrite and powder iron.

12. The CCP processing system of claim 1, wherein said upper electrode is configured with an electrostatic shield having slits all the way through the surface of the upper electrode generally radial to said inductor coils.

13. The CCP processing system of claim 1, wherein inductor coils in said array of inductor coils arrangement are arranged in a self-similar pattern.

14. The CCP processing system of claim 1, wherein said inductor coils in said array of inductor coils arrangement are arranged in a predetermined pattern.

15. The CCP processing system of claim 1, wherein said upper electrode is counter-bored to at least partially bury said individual ones of at least a subset of said plurality of inductor coils in said upper electrode.

16. The CCP processing system of claim 1, wherein inductor coils in said array of inductor coils arrangement are arranged in an alternating concentric ring pattern.

17. A plasma processing system having a plasma processing chamber capable of both CCP processing and inductively-coupled plasma processing for processing a substrate, comprising:
    at least an upper electrode and a lower electrode for processing said substrate, said substrate being disposed on said lower electrode during plasma processing wherein the upper electrode has at least one slit extending through the upper electrode; and
    an array of inductor coils arrangement having a plurality of inductor coils, said array of inductor coils arrangement being disposed above and in contact with said upper electrode, each inductor coil of said array of inductor coils arrangement employing a single unitary magnetic core of magnetic material and configured to inductively sustain plasma in a gap between said upper electrode and said lower electrode, wherein individual ones of at least a subset of said plurality of inductor coils are independently controllable with respect to and between phase and RF power and wherein magnetic cores of adjacent ones of said a subset of said plurality of inductor coils are arranged in an alternating pole configuration, wherein a first magnetic core in said magnetic cores is separated from an adjacent magnetic core of said magnetic cores that is adjacent to said first magnetic core by a distance of about 25 percent to 100 percent of said gap between said upper electrode and said lower electrode.

18. The plasma processing system of claim 17 wherein said magnetic core material is formed from ferrite.

19. The plasma processing system of claim 17, wherein said magnetic core material is formed from powder iron.

* * * * *